United States Patent
Hsieh et al.

(10) Patent No.: US 9,515,108 B2
(45) Date of Patent: Dec. 6, 2016

(54) IMAGE SENSORS WITH CONTAMINATION BARRIER STRUCTURES

(71) Applicant: SEMICONDUCTOR COMPONENTS INDUSTRIES, LLC, Phoenix, AZ (US)

(72) Inventors: Yu-Te Hsieh, Taoyuan (TW); Weng-Jin Wu, Hsinchu (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 47 days.

(21) Appl. No.: 14/644,456

(22) Filed: Mar. 11, 2015

(65) Prior Publication Data
US 2016/0268325 A1    Sep. 15, 2016

(51) Int. Cl.
*H01L 27/146* (2006.01)
*H04N 5/225* (2006.01)

(52) U.S. Cl.
CPC ... *H01L 27/14618* (2013.01); *H01L 27/14687* (2013.01); *H04N 5/2253* (2013.01)

(58) Field of Classification Search
CPC .............. H01L 27/14618; H01L 27/14687; H04N 5/2253
See application file for complete search history.

(56) References Cited

U.S. PATENT DOCUMENTS

| | | | |
|---|---|---|---|
| 5,918,363 A | 7/1999 | George et al. | |
| 5,942,798 A | 8/1999 | Chiu | |
| 6,214,635 B1 | 4/2001 | Akram et al. | |
| 2009/0273094 A1* | 11/2009 | Ha | H01L 23/49816 257/777 |
| 2009/0321863 A1* | 12/2009 | Borthakur | H01L 21/6835 257/432 |
| 2010/0200898 A1* | 8/2010 | Lin | H01L 27/14618 257/294 |
| 2013/0028589 A1* | 1/2013 | Zung | H04N 5/2257 396/529 |
| 2013/0221470 A1* | 8/2013 | Kinsman | H01L 27/14618 257/434 |
| 2013/0270230 A1 | 10/2013 | Cheung et al. | |

* cited by examiner

*Primary Examiner* — Gevell Selby
(74) *Attorney, Agent, or Firm* — Treyz Law Group, P.C.; Vineet Dixit; Joseph F. Guihan

(57) ABSTRACT

An image sensor package including a barrier structure to prevent image sensor die contamination is described. A barrier structure may surround an image sensor die that is attached on an image sensor carrier. The barrier structure may be attached to a transparent window structure as well as a package substrate. The barrier structure may extend through a hole in the package substrate. The image sensor carrier may be mounted to the package substrate using a thermal compression head that is able to apply independently varying compressive forces to corresponding regions of a surface at a given time. The thermal compression head may be used to cure the barrier structure and/or adhesives used in the image sensor package. Underfill adhesive may be deposited between discrete mounting structures used to mount the package substrate to the image sensor carrier, after the barrier structure has been applied.

15 Claims, 7 Drawing Sheets

IMAGE SENSORS WITH CONTAMINATION BARRIER STRUCTURES

BACKGROUND

This relates generally to imaging systems, and more particularly to package structures for image sensors.

Electronic devices such as cellular telephones, cameras, and computers often include imaging systems that include digital image sensors for capturing images. Image sensors may be formed having a two-dimensional array of image pixels that convert incident photons (light) into electrical signals. Electronic devices often include displays for displaying captured image data.

Image sensors formed on a die are often packaged to enable an imaging system to easily incorporate an image sensor into its design and architecture. In conventional package structures for image sensors, an image sensor die is bonded to a package substrate using discrete mounts. Bonding the image sensor to a package substrate using discrete mounts is known as flip-chip bonding.

After bonding the image sensor to a package substrate using flip-chip bonding, an electrically insulating adhesive is deposited in between the gaps between the discreet mounts, in a process known as underfilling. Adhesives used in an underfilling process may be referred to as underfill adhesives. Underfill adhesives may be used to redistribute stress away from solder joints, and prolong the thermal aging of solder joints of the discrete mounts.

In conventional image sensor packaging, image pixel arrays of an image sensor are susceptible to damage or contamination by underfill adhesives applied during the packaging process, as well as damage or contamination by environmental particles or particles from a mounting substrate. Additionally, conventional image sensor packaging often lacks sufficient rigidity for certain operating conditions. Furthermore, it is difficult to adjust the alignment of various structures in conventional image sensor packages during manufacture.

Therefore, it would be desirable to provide improved image sensor packaging.

DETAILED DESCRIPTION

Figure 1:
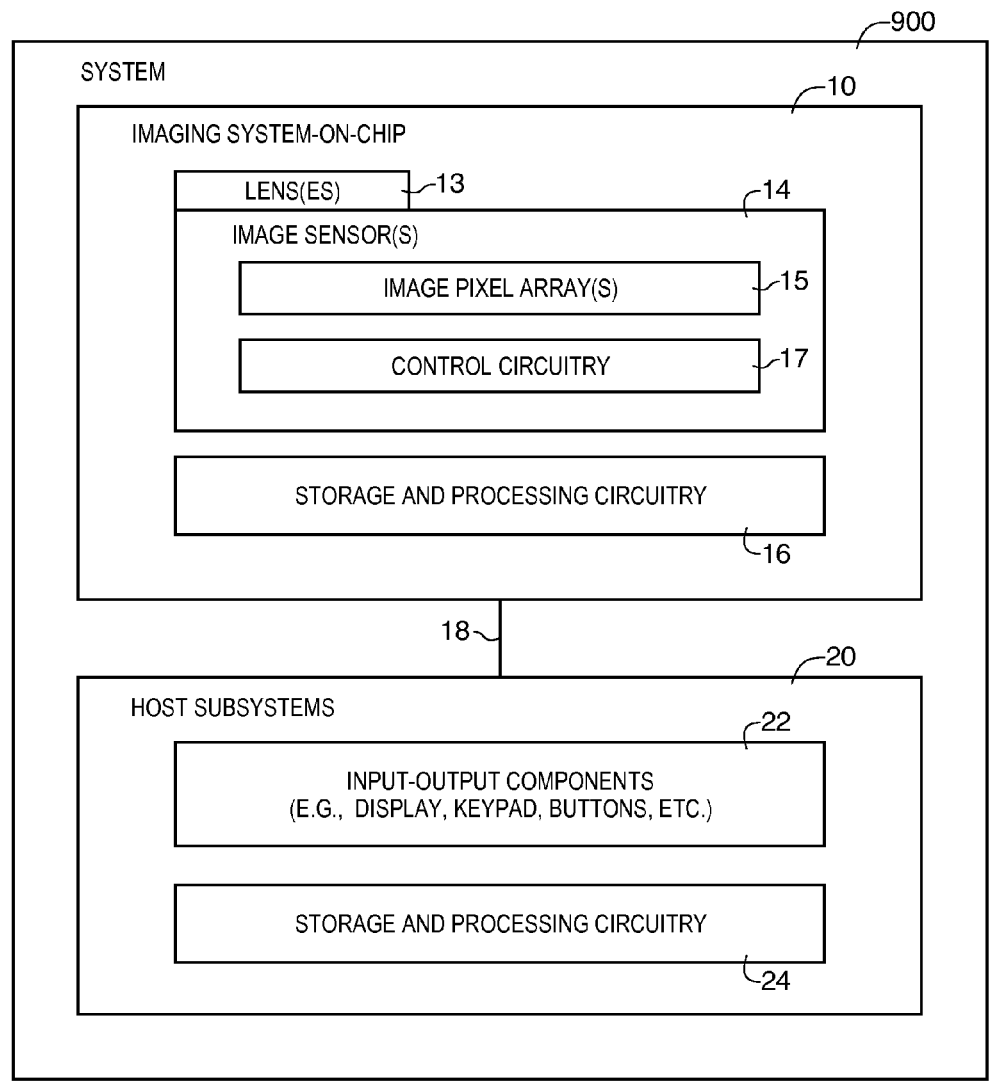
FIG. 1 is a diagram of an illustrative system that includes an imaging system and a host subsystem in accordance with an embodiment.

FIG. 1 is a diagram of an illustrative system including an imaging system for capturing images. System 900 of FIG. 1 may be a vehicle safety system (e.g., a rear-view camera or other vehicle safety system), a surveillance system, an electronic device such as a camera, a cellular telephone, a video camera, or any other desired electronic device that captures digital image data.

As shown in FIG. 1, system 900 may include an imaging system such as imaging system 10 and host subsystems such as host subsystem 20. Imaging system 10 may be an imaging system-on-chip that is implemented on a single silicon image sensor integrated circuit die. Imaging system 10 may include one or more image sensors 14 and one or more associated lenses 13. Lenses 13 in imaging system 10 may, as examples, include a single wide angle lens or M*N individual lenses arranged in an M×N array. Individual image sensors 14 may be arranged as a corresponding single image sensor or a corresponding M×N image sensor array (as examples). The values of M and N may each be equal to or greater than one, may each be equal to or greater than two, may exceed 10, or may have any other suitable values.

Each image sensor in imaging system 10 may be identical or there may be different types of image sensors in a given image sensor array integrated circuit. As one example, each image sensor may be a Video Graphics Array (VGA) sensor with a resolution of 480×640 image sensor pixels (as an example). Other arrangements of image sensor pixels may also be used for the image sensors if desired. For example, images sensors with greater than VGA resolution (e.g., high-definition image sensors), less than VGA resolution and/or image sensor arrays in which the image sensors are not all identical may be used.

During image capture operations, each lens 13 may focus light onto an associated image sensor 14. Image sensor 14 may include one or more arrays of photosensitive elements such as image pixel array(s) 15. Photosensitive elements (image pixels) such as photodiodes on arrays 15 may convert the light into electric charge. Image sensor 14 may also include control circuitry 17. Control circuitry 17 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, and other circuitry for operating the image pixels of image pixel array(s) 15 and converting electric charges into digital image data. Control circuitry 17 may include, for example, pixel row control circuitry coupled to arrays 15 via row control lines and column control and readout circuitry coupled to arrays 15 via column readout and control lines.

Still and video image data from imaging system 10 may be provided to storage and processing circuitry 16. Storage and processing circuitry 16 may include volatile and/or nonvolatile memory (e.g., random-access memory, flash memory, etc.). Storage and processing circuitry 16 may include microprocessors, microcontrollers, digital signal processors, application specific integrated circuits, etc.

Image processing circuitry 16 may be used to store image data and perform image processing functions such as data formatting, adjusting white balance and exposure, implementing video image stabilization, face detection, image data write control, image data read control, output image pixel address to input image pixel address transformation, etc. Storage and processing circuitry 16 may include one or more conformal image buffers, a pixel transformation engine, a write control engine, a read control engine, an interpolation engine, a transformation engine, etc.

In one suitable arrangement, which is sometimes referred to as a system-on-chip (SOC) arrangement, image sensor(s) 14 and image processing circuitry 16 are implemented on a common semiconductor substrate (e.g., a common silicon image sensor integrated circuit die). If desired, image sensor (s) 14 and image processing circuitry 16 may be formed on separate semiconductor substrates. For example, sensor 14 and processing circuitry 16 may be formed on separate substrates that are stacked.

Imaging system 10 (e.g., processing circuitry 16) may convey acquired image data to host subsystem 20 over path 18. Host subsystem 20 may include a display for displaying image data captured by imaging system 10. Host subsystem 20 may include processing software for detecting objects in images, detecting motion of objects between image frames, determining distances to objects in images, filtering or otherwise processing images provided by imaging system 10. Host subsystem 20 may include a warning system configured to generate a warning (e.g., a warning light on an automobile dashboard, an audible warning or other warning) in the event objects in captured images are determined to be less than a predetermined distance from a vehicle in scenarios where system 900 is an automotive imaging system.

If desired, system 900 may provide a user with numerous high-level functions. In a computer or advanced cellular telephone, for example, a user may be provided with the ability to run user applications. To implement these functions, host subsystem 20 of system 900 may have input-output devices 22 and storage and processing circuitry 24. Input-output devices 22 may include keypads, input-output ports, joysticks, buttons, displays, etc. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, etc.

The image pixels of image pixels array(s) 15 may each include a photosensitive element such as photodiode, a positive power supply voltage terminal, a ground voltage terminal and additional circuitry such as reset transistors, source follower transistors, row-select transistors, charge storage nodes, etc. Image pixels in image pixel array(s) 15 may be three-transistor pixels, pin-photodiode pixels with four transistors each, global shutter pixels, time-of-flight pixels, or may have any other suitable photo-conversion architectures.

Figure 2:
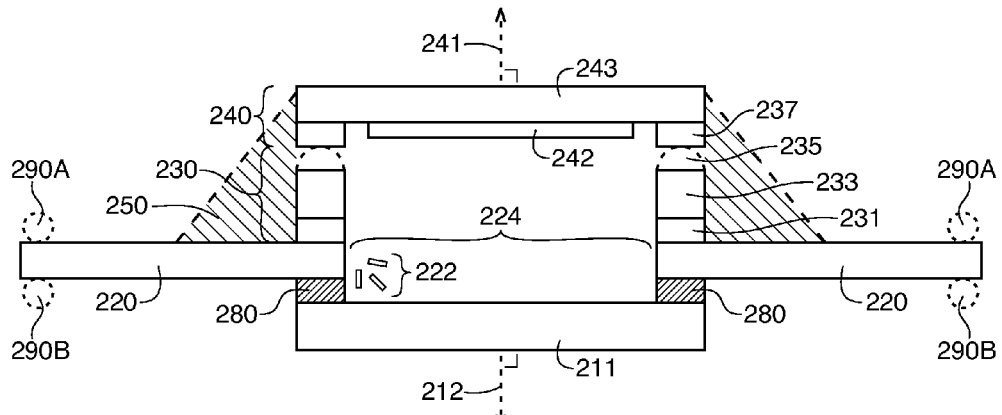
FIG. 2 is a diagram showing a conventional image sensor package.

FIG. 2 illustrates a conventional image sensor package. Image sensor 240 includes an image sensor die 242 and an image sensor carrier 243. Image sensor die 242 also includes an array of image pixels, as described above in connection with image pixel arrays 15. Image sensor carrier 243 has a plurality of contact pads 237 that are used to provide electrical connections to various electrical components on the image sensor die 242 via metal traces and/or bond wires (not shown) that may be formed on the image sensor carrier 243. Image sensor normal vector 241 indicates a direction normal to the plane of the chip carrier 243 and/or the image sensor die 242. Image sensor 240 is mounted to a package substrate 220 using a plurality of discrete mounts 230. Package substrate 220 is a printed circuit board made of glass fiber.

Discrete mount 230 may include a pillar bump 233 with solder 235 formed above the pillar bump 233. Pillar bump 233 is formed from copper. Pillar bump 233 is formed on a contact pad 231 of the substrate 220 that is electrically coupled by metal traces and/or bond wires to other electrical components (not shown) that are mounted on substrate 220. Ball mounts 290 are formed on substrate 220. Ball mounts 290 are solder balls that are formed on a given side of the substrate 220. Ball mounts 290A are shown being formed on the same side of the substrate as the image sensor 240. Ball mounts 290B are shown being formed on the opposite side of the substrate as the image sensor 240.

On the opposite side of the substrate 220 as the image sensor 240, a window 211 is attached to the substrate 220 using an adhesive 280. A window 211 is formed of glass. Window normal vector 212 indicates a direction normal to the plane of window 211 and/or substrate 220. A punch-hole 224 is formed in substrate 220. The area of the punch-hole 224 is greater than the area of image sensor die 242. The punch-hole 224 allows light incident upon the window 211 to reach the image sensor die 242. Underfill adhesive 250 is deposited on the substrate between gaps of the discrete mounts 230. Underfill adhesive 250 is deposited on the substrate after the solder 235 has been reflowed or melted to bond pillar bumps 233 to contact pads 237 of the image sensor carrier 243.

Conventional image sensor packaging such as the package shown in FIG. 2 allow particles 222 such as glass fibers from the substrate 220, or particles from the environment in which the chip is manufactured to float freely in the cavity formed by the punch-hole 224 between the image sensor 240 and the window 211. Particles 222 often damage the image sensor die 242, thereby reducing the yield of packaged image sensors shown in FIG. 2. Furthermore, when underfill adhesive 250 is deposited between the discrete mounts 230, it extends into the cavity between the window 211 and the image sensor 240 and contaminates the image sensor 240 or the window 211, and reduces the yield of packaged image sensors shown in FIG. 2.

It is desirable to have image sensor normal vector 241 and window normal vector 212 be parallel in a packaged image sensor. In conventional image sensor packaging, it is difficult to align vectors 212 and 241 to be parallel, since the only adjustment of the angle between the two vectors can occur when the solder 235 is melted and attached to the contact pad 237 during flip chip (FC) bonding.

Figure 3:
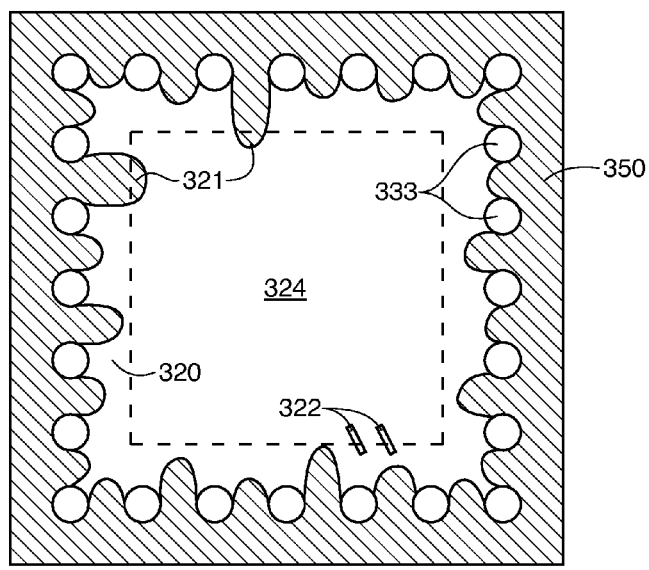
FIG. 3 is a diagram showing a top-down view of a conventional image sensor package.

FIG. 3 illustrates a top-down view of a conventional image sensor package, highlighting the drawbacks of conventional image sensor packaging. Punch hole 324 corresponds to an opening formed in a substrate 320 such as punch hole 224 in substrate 220 of FIG. 2. A plurality of discrete mounts 333 are formed around the punch hole 324 on a substrate 320. Underflow adhesive 350 is deposited between the discrete mounts 333. As illustrated by regions 321, underflow adhesive extends into the punch-hole 324. Underflow adhesive in regions 321 that extends into the punch-hole 324 damages image sensor die 242 or window 211, thereby limiting the full operational capabilities of a packaged image sensor, or even rendering the packaged image sensor inoperable. Particles 322 from a substrate 320 or from the environment in which the image sensor is packaged also enter the punch hole 324 region and contaminate the window 211 or image sensor die 242.

Figure 4:
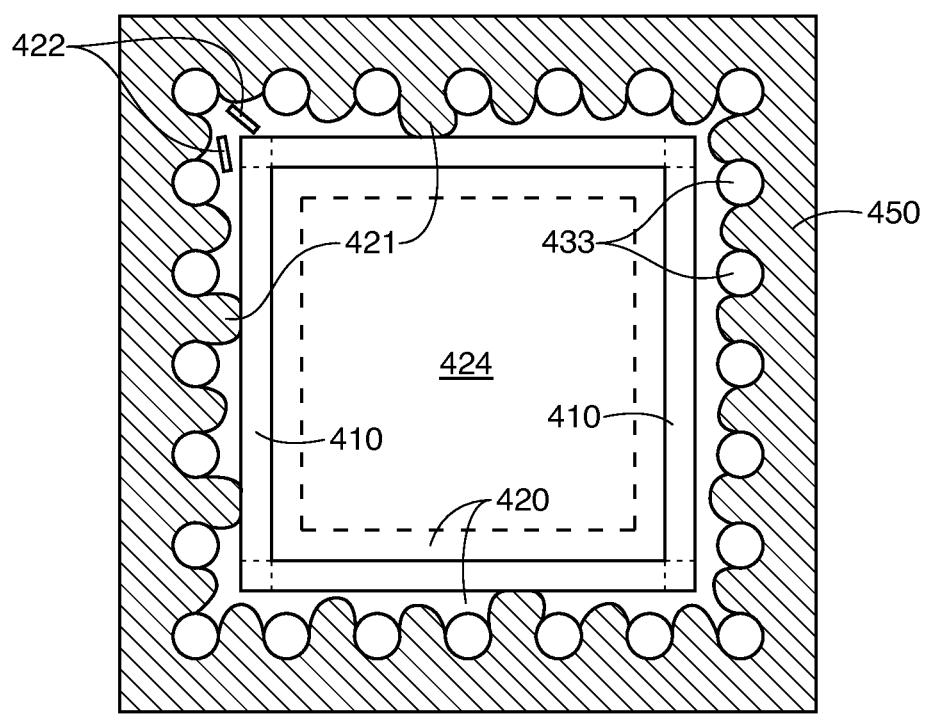
FIG. 4 is a diagram showing a top-down view of an illustrative image sensor package in accordance with an embodiment.

FIG. 4 illustrates a top-down view of an image sensor package in accordance with an embodiment. An opening such as punch hole 424 may be formed in a substrate 420. A plurality of discrete mounts such 433 may be formed on the substrate 420, surrounding the punch hole 424. Underfill adhesive 450 may be deposited between the discrete mounts 433. A barrier structure 410 may be formed on the substrate 420 between the punch hole 424 and the discrete mounts 433. Barrier structure 410 may be formed as a single structure, or out of a plurality of connected structures comprising structures separated by any subset of the dashed lines in structure 410 shown in FIG. 4.

Particles 422 from either the substrate 420 or from the environment the image sensor is packaged may be blocked from entering the punch hole 424 by the barrier structure 410. Regions 421 of excess underfill adhesive 450 may be prevented from entering the punch hole 424 by barrier structure 410. Barrier structure 410 may be formed of a dry film, or a B-stage epoxy resin, or any other material with similar dielectric properties.

Figure 5:
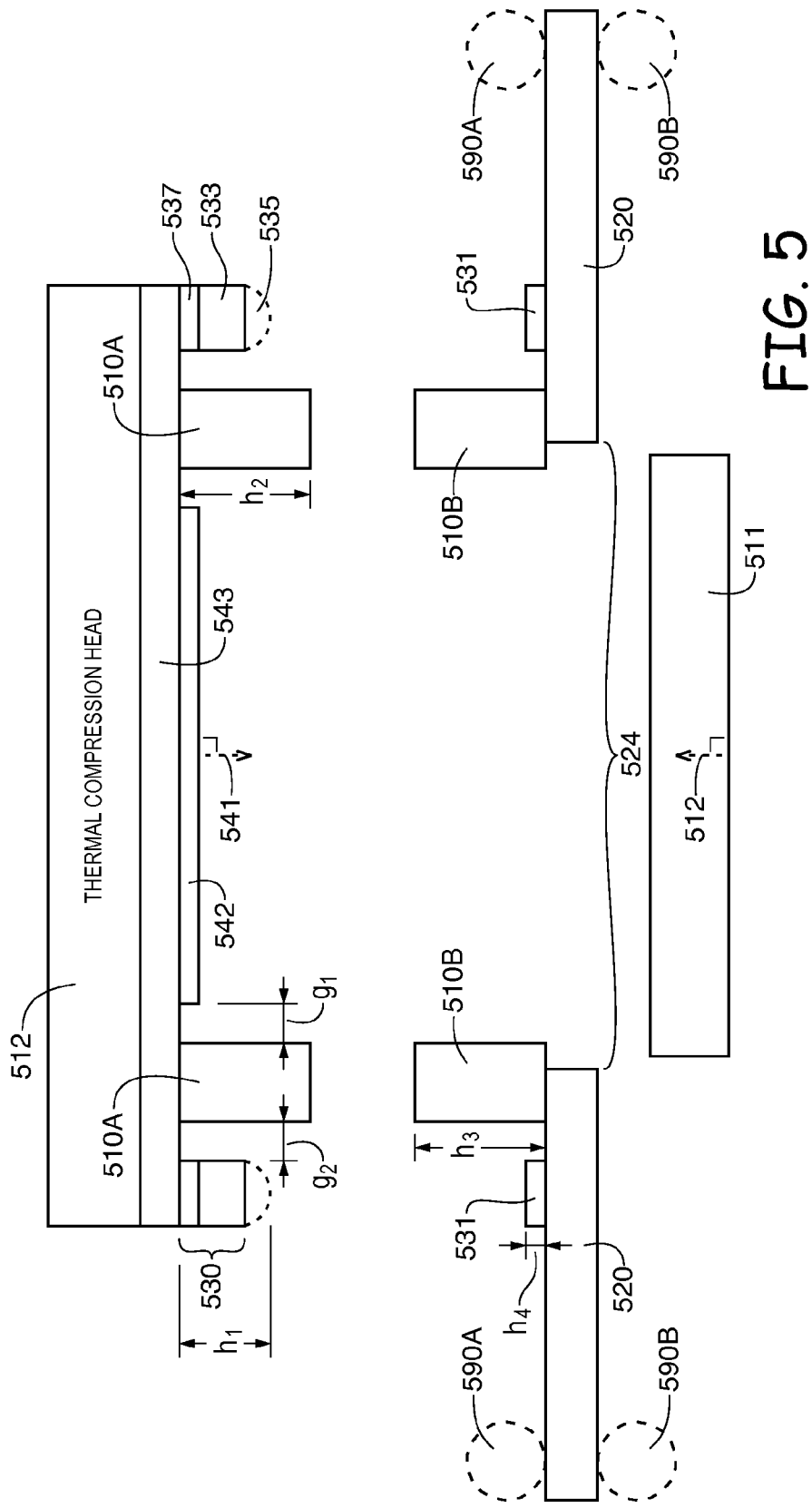
FIG. 5 is a diagram showing an illustrative image sensor package before mounting in accordance with an embodiment.

FIG. 5 illustrates an image sensor package before flip chip mounting has taken place, in accordance with an embodiment. An image sensor die 542 may be mounted on an image sensor carrier 543. Image sensor die 542 may include an array of image pixels, as described above in connection with image pixel arrays 15 of FIG. 1. Image sensor carrier 543 may have a plurality of contact pads 537 that are used to provide electrical connections to various electrical components on the image sensor die 542 via metal traces and/or bond wires (not shown) that may be formed on the image sensor carrier 543. Image sensor normal vector 541 may indicate a direction normal to the plane of the chip carrier 543 and/or the image sensor die 542. Image sensor 540 is shown in FIG. 5 to be separated from a package substrate 520, as the flip chip (FC) bonding has not yet taken place.

Package substrate 520 may be a printed circuit board made of glass fiber, or any other suitable laminate material such as FR-5 materials. Discrete mount 530 may include a pillar bump 533 with solder 535 formed on the pillar bump 533. Pillar bump 533 may be formed from copper or any suitable electrically conductive material. Pillar bump 533 may be formed on a contact pad 537 of the image sensor carrier 543, as shown in FIG. 5. Alternatively, pillar bump 533 may be formed on a contact pad 531 of the package substrate 520 that is electrically coupled by metal traces and/or bond wires to other electrical components (not shown) that are mounted on substrate 520.

Ball mounts 590 may be formed on substrate 520. Ball mounts 590 may be solder balls that are formed on a given side of the substrate 520. Ball mounts 590A are shown being formed on the same side of the substrate as the image sensor carrier 543. Ball mounts 590B are shown being formed on the opposite side of the substrate as the image sensor carrier 543.

A punch-hole 524 may be formed in substrate 520. The area of the punch-hole 524 may be at least the same as the area of an image sensing region on the image sensor die 542. The punch-hole 524 may allow light incident upon a window 511 to reach the image sensor die 242. Window 511 may be formed of glass, plastic, or any other suitable transparent material. Window 511 may be any transmittive element through which light can pass. In the embodiment of FIG. 5, the dimensions of window 511 are about the same or slightly smaller than the dimensions of punch hole 524. Window normal vector 512 may indicate a direction normal to the plane of window 511 and/or substrate 520. Window 511 may be a lens element such as a field flattener lens. Window 511 may be a temporary element that is later removed. Window 511 is optional and may alternatively be omitted.

Barrier structures 510 may be formed on the image sensor carrier 543 and/or the package substrate 520. Barrier structure 510, like barrier structure 410 in FIG. 4, may be formed out of dry film, B-stage resin, or any other material with similar dielectric properties. Barrier structures 510A formed on the image sensor carrier 543 may have a first height $h_2$ and barrier structures 510B formed on substrate 520 may have a second height $h_3$. Generally, the heights $h_2$ and $h_3$ of barrier structures 510A and 510B respectively may be greater than or equal to the height $h_1$ of discrete mounts 530. The heights $h_2$ and $h_3$ may also be greater or equal to than the combined height of pillar structure 530 $h_1$ and the height of package contact pad 531 $h_4$ (i.e. $h_2 \geq h_1 + h_4$ and $h_3 \geq h_1 + h_4$). Barrier structure 510A may be used without using barrier structure 510B. Barrier structure 510B may be used without using barrier structure 510A. In certain embodiments, both barrier structures 510A and 510B may be used, in which case the combined heights of barrier structures 510A and 510B may be greater than the combined heights of pillar structure 530 and package contact pad 531 (i.e. $h_2 + h_3 \geq h_1 + h_4$).

Barrier structure 510 may be separated from the edge of image sensor die 542 by a first gap distance $g_1$ and may be separated from the edge of discrete mount 530 by a second gap distance $g_2$. Window 512 may be attached to barrier structure 520; gaps $g_1$ may be adjusted so that a sufficient area of barrier structure 510 extends into the punch hole region 524 to firmly connect to window 511. Gaps $g_1$ may also be equal to zero.

Thermal compression head 512 may be used to cure the material used in barrier structure 510. Thermal compression head 512 may also be used to apply heat and/or pressure to chip carrier to properly package the image sensor. Heat produced from thermal compression head 512 may melt solder 535 and allow it to flow onto contact pad 531.

Figure 6:
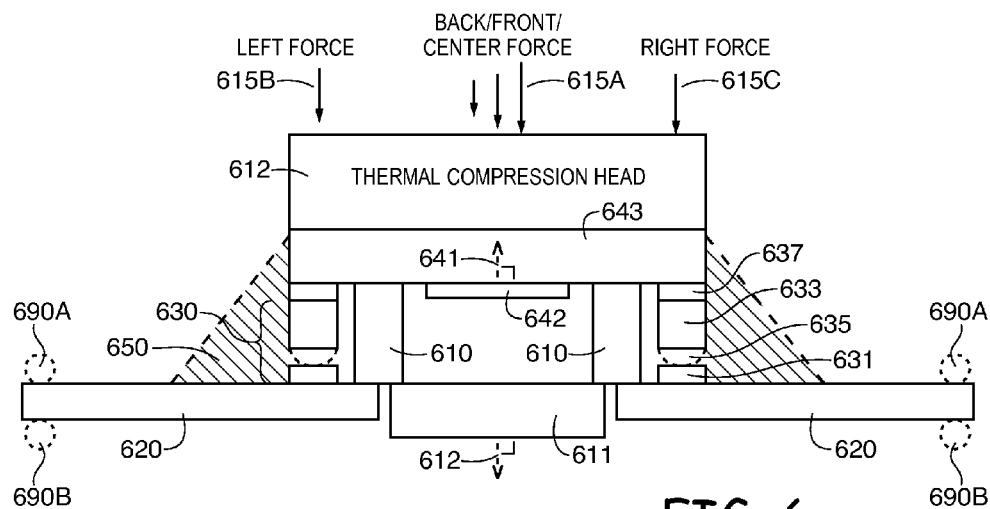
FIG. 6 is a diagram showing an illustrative image sensor package after mounting in accordance with an embodiment.

FIG. 6 illustrates an image sensor package after flip chip (FC) mounting, in an embodiment. FC mounting may involve bonding solder 635 on pillar bump 633 to package contact pad 631 on package 620. Discrete mount 630 may include a pillar bump 633 with solder 635 formed on the pillar bump 633. FC mounting may generally refer to electrically coupling circuitry (not shown) on image sensor die 642 to circuitry (not shown) on package substrate 620. An image sensor die 642 may be mounted on an image sensor carrier 643. Circuitry on image sensor die 642 may be coupled to contact pads 637 using metal traces or bond wires (not shown) formed on image sensor carrier 643. Image sensor die 642 may include an array of image pixels, as described above in connection with image pixel arrays 15 of FIG. 1. Image sensor carrier 643 may have a plurality of contact pads 637 that are used to provide electrical connections to various electrical components on the image sensor die 642 via metal traces and/or bond wires (not shown) that may be formed on the image sensor carrier 643. Image sensor normal vector 641 may indicate a direction normal to the plane of the chip carrier 643 and/or the image sensor die 642.

Package substrate 620 may be a printed circuit board made of glass fiber, or any other suitable laminate material such as FR-5 materials. Discrete mount 630 may include a pillar bump 633 with solder 635 formed on the pillar bump 633. Pillar bump 633 may be formed from copper or any suitable electrically conductive material. Pillar bump 633 may be formed on a contact pad 637 of the image sensor carrier 643, as shown in FIG. 6. Alternatively, pillar bump 633 may be formed on a contact pad 631 of the package substrate 620 that is electrically coupled by metal traces and/or bond wires to other electrical components (not shown) that are mounted on substrate 620.

Ball mounts 690 may be formed on substrate 620. Ball mounts 690 may be solder balls that are formed on a given side of the substrate 620. Ball mounts 690A are shown being formed on the same side of the substrate as the image sensor carrier 643. Ball mounts 690B are shown being formed on the opposite side of the substrate as the image sensor carrier 643.

Window 611 may be formed of glass, plastic, or any other suitable transparent material. Window 611 may be any transmittive element through which light can pass. Window 611 may be a lens element such as a field flattener lens. Window 611 may be a temporary element that is later removed. Window 611 is optional and may alternatively be omitted. In the embodiment of FIG. 6, the dimensions of window 611 are about the same or slightly smaller than the dimensions of an opening in substrate 620, similar to punch hole 524 of FIG. 5. In other words, the opening in substrate 620 may have an area that is at least the same as the area of an image sensing region on the image sensor die 642. Window normal vector 612 may indicate a direction normal to the plane of window 611 and/or substrate 620. Window 611 may be attached to a lower surface of barrier structure 610. The lower surface of barrier structure 610 may also be attached to the package substrate 620. As shown in FIG. 6, there may be a gap between window 611 and package substrate 620. Alternatively, there may be no gap between window 611 and package substrate 620. The lower surface of window 611 may be on the same plane as the lower surface of package substrate 620. The upper surface of window 611 may be on the same plane as the upper surface of package substrate 620. The window 611 may have the same thickness as the package substrate 620. An upper surface of barrier structure 610 may be attached to image sensor carrier 643. Barrier structure 610 may be formed of a dry film, or a B-stage epoxy resin, or any other material with similar dielectric properties.

Thermal compression head 612 may be used to cure the material used in barrier structure 610. Thermal compression head 612 may also be used to apply heat and/or pressure to chip carrier to properly package the image sensor. Heat produced from thermal compression head 612 may melt solder 635 and allow it to flow onto contact pad 631, thereby electrically connecting contact pad 631 of the package substrate 620 with contact pad 637 of the image sensor carrier 643. FIG. 6 shows thermal compression head 612 being positioned above image sensor carrier 643; however, thermal compression head 612 can alternatively be positioned on window 611 and/or substrate package 620.

Thermal compression head 612 may also be used to align image sensor normal vector 641 and window normal vector 612 so that they are parallel. Thermal compression head 612 may be able to apply a plurality of forces 615 on the image sensor carrier as shown in FIG. 6. If thermal compression head 612 is positioned on window 611 and/or substrate 620, then it may apply the same forces 615 to window 611 and/or substrate 620. Thermal compression head may apply a left force 615B to the image sensor carrier 643 to apply greater compressive force (or pressure) to the left side of the image sensor carrier 643 than to the right side of the image senor carrier 643, during flip chip bonding or during any other stage of manufacturing the image sensor package of FIG. 6. Applying left force 615B may, in some cases, help align normal vectors image sensor normal vector 641 and window normal vector 612. Applying left force 615B may be appropriate when the angle between window normal vector 612 and image sensor normal vector 641 (as drawn) is less than 180 degrees with respect to the vector components in the plane of FIG. 6.

Thermal compression head may also apply a right force 615C to the image sensor carrier 643 to apply greater compressive force (or pressure) to the right side of the image sensor carrier 643 than to the left side of the image senor carrier 643, during flip chip bonding or during any other stage of manufacturing the image sensor package of FIG. 6. Applying right force 615C may, in some cases, help align normal vectors image sensor normal vector 641 and window normal 612. Applying left force 615B may be appropriate when the angle between window normal vector 612 and image sensor normal vector 641 (as drawn) is greater than 180 degrees with respect to the vector components in the plane of FIG. 6.

Thermal compression head may also apply a back/front/center force 615A to the image sensor carrier 643 to apply a greater force to the back, front (in and out of the page of FIG. 6, respectively) and center portions, respectively of image sensor carrier 643 than to other portions of the image sensor carrier 643. Back/front/center forces 615A may be applied during flip chip bonding or during any other stage of manufacturing the image sensor package of FIG. 6. In general, the magnitude of any one of the forces 615 may be different than any other one of the forces 615.

After flip chip bonding has occurred, and solder 631 is melted onto contact pads 631, underfill adhesive 650 may be deposited between discrete mounts 630. Underfill adhesive 650 may be deposited on the substrate between gaps of the discrete mounts 630. Underfill adhesive 650 may be deposited on the substrate after the solder 635 has been reflowed or melted to bond pillar bumps 633 to contact pads 637 of the image sensor carrier 243. As described in connection with FIG. 4 above, underfill 650 will be blocked by barrier 610 and not be able to contaminate image sensor 642 or window 712. FIG. 6 shows a single barrier structure 610, which may be formed out of two separate barrier structures formed on image sensor carrier 643 and package substrate 620 as are barriers 510A and 510B respectively, in FIG. 5. If two separate barrier structures are formed, it may be desirable if the height of the barrier structure formed on image sensor carrier 643 is greater than the height of the discrete mounts 630. Alternatively, a barrier 610 may be a single structure that may be formed on either image sensor carrier 643 or package substrate 620 before being cured. It may be desirable that the height of the barrier 610 is greater than the height of the discrete mounts 630.

Figure 7:
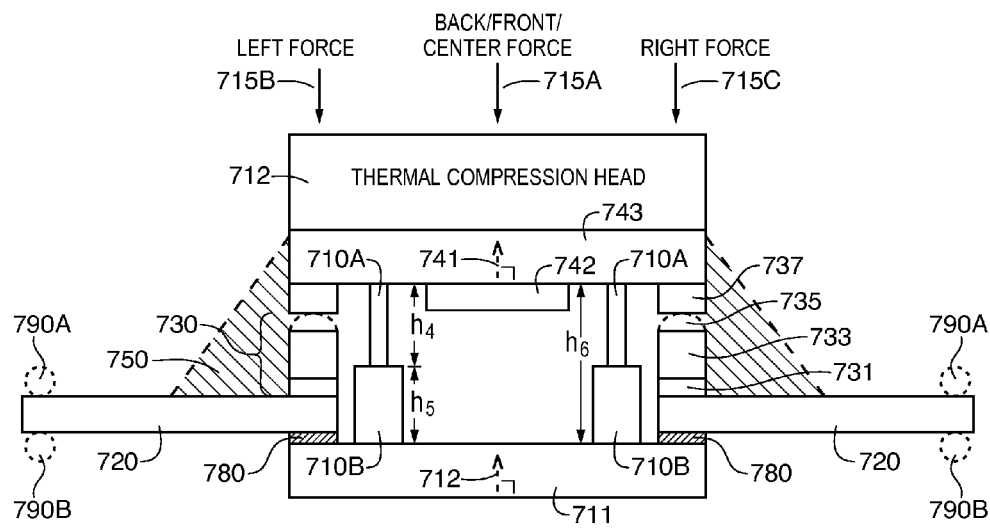
FIG. 7 is a diagram showing an alternate image sensor package after mounting in accordance with an embodiment.

FIG. 7 illustrates an alternate embodiment of image sensor packaging in accordance with an embodiment. FC mounting may involve bonding solder 735 on pillar bump 733 to package contact pad 731 on package 720. Discrete mount 730 may include a pillar bump 733 with solder 735 formed on the pillar bump 733. FC mounting may generally refer to electrically coupling circuitry (not shown) on image sensor die 742 to circuitry (not shown) on package substrate 720. An image sensor die 742 may be mounted on an image sensor carrier 743. Circuitry on image sensor die 742 may be coupled to contact pads 737 using metal traces or bond wires (not shown) formed on image sensor carrier 743. Image sensor die 742 may include an array of image pixels, as described above in connection with image pixel arrays 15 of FIG. 1. Image sensor carrier 743 may have a plurality of contact pads 737 that are used to provide electrical connections to various electrical components on the image sensor die 742 via metal traces and/or bond wires (not shown) that may be formed on the image sensor carrier 743. Image sensor normal vector 741 may indicate a direction normal to the plane of the chip carrier 743 and/or the image sensor die 742.

Package substrate 720 may be a printed circuit board made of glass fiber, or any other suitable laminate material such as FR-5 materials. Discrete mount 730 may include a pillar bump 733 with solder 735 formed on the pillar bump 733. Pillar bump 733 may be formed from copper or any suitable electrically conductive material. Pillar bump 733 may be formed on a contact pad 731 of the package substrate 720 that is electrically coupled by metal traces and/or bond wires to other electrical components (not shown) that are mounted on substrate 720, as shown in FIG. 7. Alternatively, pillar bump 733 may be formed on a contact pad 737 of the image sensor carrier 743.

Ball mounts 790 may be formed on substrate 720. Ball mounts 790 may be solder balls that are formed on a given side of the substrate 720. Ball mounts 790A are shown being formed on the same side of the substrate as the image sensor carrier 743. Ball mounts 790B are shown being formed on the opposite side of the substrate as the image sensor carrier 743.

Window 711 may be formed of glass, plastic, or any other suitable transparent material. Window 711 may be any transmittive element through which light can pass. Window 711 may be a lens element such as a field flattener lens. Window 711 may be a temporary element that is later removed. Window 711 is optional and may alternatively be omitted. In the embodiment of FIG. 7, the dimensions of window 711 are greater than the dimensions of an opening in substrate 720, similar to punch hole 524 of FIG. 5. In other words, the opening in substrate 720 may have an area that is at least the same as the area of an image sensing region on the image sensor die 742. Window normal vector 712 may indicate a direction normal to the plane of window 711 and/or substrate 720. Window 711 may be attached to a lower surface of barrier structure 710B. Window 711 may also be attached to the package substrate 720 by an adhesive layer 780. Adhesive layer 780 may be a UV curable resin, a heat curable resin, an epoxy resin, or any other suitable adhesive. An upper surface of barrier structure 710A may be attached to image sensor carrier 743. Barrier structure 710 may be formed of a dry film, or a B-stage epoxy resin, or any other material with similar dielectric properties.

Thermal compression head 712 may be used to cure the material used in barrier structure 710. Thermal compression head 712 may also be used to apply heat and/or pressure to chip carrier to properly package the image sensor. Heat produced from thermal compression head 712 may melt solder 735 and allow it to flow onto contact pad 737, thereby electrically connecting contact pad 731 of the package substrate 720 with contact pad 737 of the image sensor carrier 743. FIG. 7 shows thermal compression head 712 being positioned above image sensor carrier 743; however, thermal compression head 712 can alternatively be positioned on window 711 and/or substrate package 720.

Thermal compression head 712 may also be used to align image sensor normal vector 741 and window normal vector 712 so that they are parallel. Thermal compression head 712 may be able to apply a plurality of forces 715 on the image sensor carrier as shown in FIG. 7. If thermal compression head 712 is positioned on window 711 and/or substrate 720, then it may apply the same forces 715 to window 711 and/or substrate 720. Thermal compression head may apply a left force 715B to the image sensor carrier 743 to apply greater compressive force (or pressure) to the left side of the image sensor carrier 743 than to the right side of the image senor carrier 743, during flip chip bonding or during any other stage of manufacturing the image sensor package of FIG. 7. Applying left force 715B may, in some cases, help align normal vectors image sensor normal vector 741 and window normal vector 712. Applying left force 715B may be appropriate when the angle between window normal vector 712 and image sensor normal vector 741 (as drawn) is less than 0 degrees with respect to the vector components in the plane of FIG. 7.

Thermal compression head may also apply a right force 715C to the image sensor carrier 743 to apply greater compressive force (or pressure) to the right side of the image sensor carrier 743 than to the left side of the image senor carrier 743, during flip chip bonding or during any other stage of manufacturing the image sensor package of FIG. 7. Applying right force 715C may, in some cases, help align normal vectors image sensor normal vector 741 and window normal 712. Applying left force 715B may be appropriate when the angle between window normal vector 712 and image sensor normal vector 741 (as drawn) is greater than 0 degrees with respect to the vector components in the plane of FIG. 7.

Thermal compression head may also apply a back/front/center force 715A to the image sensor carrier 743 to apply a greater force to the back, front (in and out of the page of FIG. 7, respectively) and center portions, respectively of image sensor carrier 743 than to other portions of the image sensor carrier 743. Back/front/center forces 715A may be applied during flip chip bonding or during any other stage of manufacturing the image sensor package of FIG. 7. In general, the magnitude of any one of the forces 715 may be different than any other one of the forces 715.

After flip chip bonding has occurred, and solder 731 is melted onto contact pads 731, underfill adhesive 750 may be deposited between discrete mounts 730. Underfill adhesive 750 may be deposited on the substrate between gaps of the discrete mounts 730. Underfill adhesive 750 may be deposited on the substrate after the solder 735 has been reflowed or melted to bond pillar bumps 733 to contact pads 737 of the image sensor carrier 243. As described in connection with FIG. 4 above, underfill 750 will be blocked by barrier 710 and not be able to contaminate image sensor 742 or window 712. FIG. 7 shows two barrier structure 710, namely 710A and 710B. Barriers 710A and 710B are shown having two different thicknesses. This is merely illustrative, as barriers 710A and 710B may have different thicknesses. Alternatively, a barrier 710 may be a single structure that may be formed on either image sensor carrier 743 or package substrate 720 before being cured.

Barrier 710A may have a first height $h_4$ whereas barrier 710B may have a second height $h_5$. The sum of these heights may be equal to the height $h_6$. In some embodiments, it may be desirable for height $h_4$ of barrier structure 710A to be greater than the height of the discrete mount 730 (not labeled).

Figure 8:
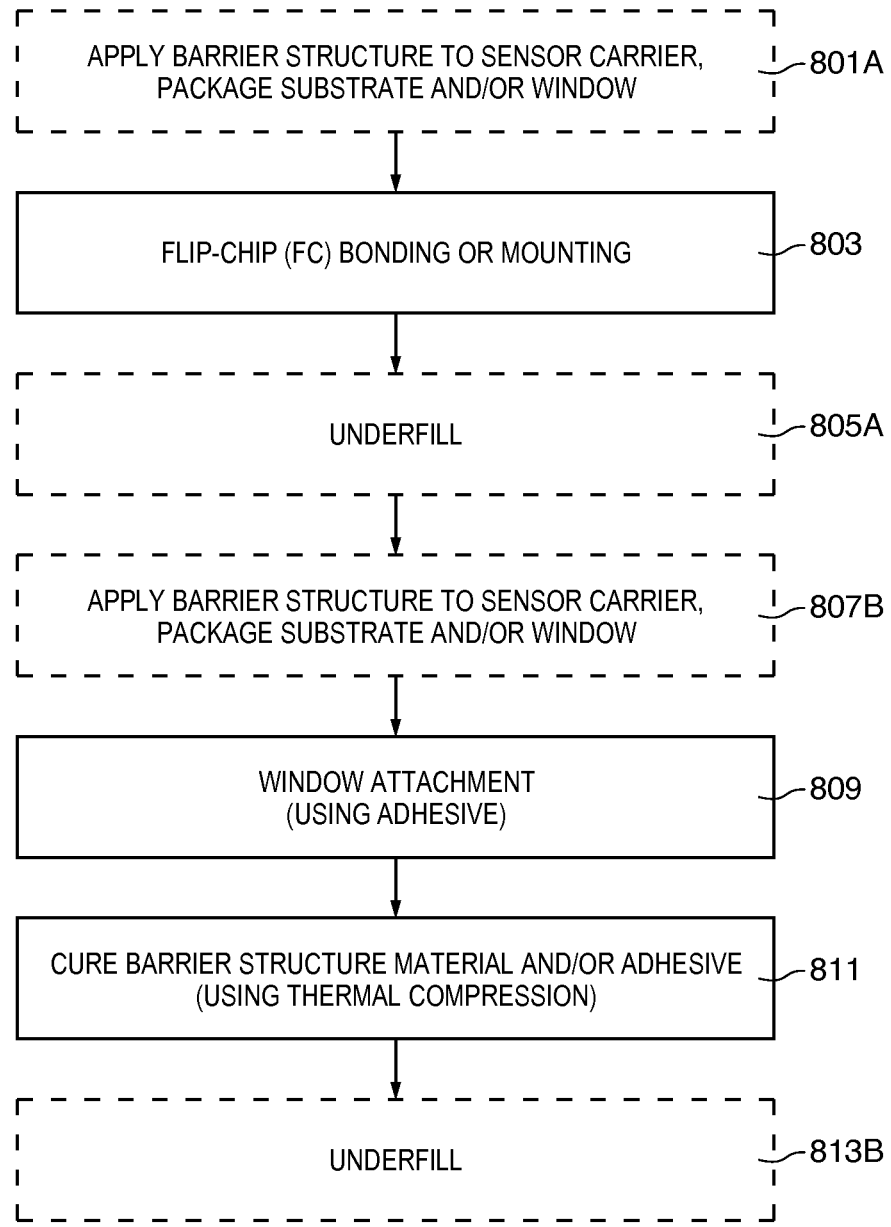
FIG. 8 is a flow chart of illustrative steps involved in manufacturing an image sensor package in accordance with an embodiment.

FIG. 8 is an illustrative flowchart of steps that may be used to create an image sensor package such as the embodiments of FIGS. 6 and 7. In a first embodiment, steps 801A and 805A may be implemented to manufacture an image sensor package, without implementing steps 807B and 813B. In a second embodiment, steps 807B and 813B may be implemented, without implementing steps 801A and 805A.

In a first embodiment, a barrier structure may be applied to an image sensor carrier, package substrate, and/or window in step 801A. A barrier structure such as 610 or 710A or may be applied to image sensor carrier 643 or 743 respectively. As described in connection with FIGS. 6 and 7, barriers 610 and 710A may have a height that is greater than the height of a discrete mount such as 630 or 730 respectively. In step 803, flip-chip bonding or mounting may occur. Solder such as 635 or 735 may be melted and flowed onto a contact pad such as 631 or 737 respectively. In flip-chip bonding, the contact pads 637/737 of the image sensor carrier 643/743 may be electrically connected to a respective contact pad 631/731 of the package substrate 620/720. The electrical connection between contact pads 637/737 and 631/731 may be performed by heat reflow of solder on a pillar bump 633/733, by ultrasonic bonding, or by thermosonic bonding of a gold stud bump (not illustrated). At this step, the normal vectors 612/712 and 641/741 may be aligned using combinations of forces 715 applied using thermal compression head 612/712.

In step 805A, underfill may be deposited between discrete mounts 630/730. In the first embodiment, if the barrier structure is not yet cured, or attached to a lower surface, such as package 620 in the embodiment of FIG. 6, or window 711 in the embodiment of FIG. 7, barrier structures such as 610/710 may prevent underfill adhesive from contaminating image sensor die 642/742 by virtue of having a height that is greater than the height of discrete mounts 630/730.

In step 809, a window may be attached to the flip chip bonded package. In the embodiment of FIG. 6, a window 611 may be attached to a lower surface of barrier structure 610. Adhesive may or may not be used to attach window 611 to the lower surface of barrier structure 610. In the embodiment of FIG. 7, window 711 may be attached to a lower surface of barrier 710B. Additionally, window 711 may be attached to package substrate 720 using adhesive 780 which may be a UV cured adhesive, heat cured adhesive, epoxy resin, or any other suitable adhesive. Adhesive may or may not be used to attach window 711 to the lower surface of barrier structure 710B.

In step 811, material of barrier structures 610/710, which may be a dry film, B-stage epoxy resin, or any other material with similar dielectric properties may be cured. Adhesive such as the adhesive used to attach window 611/711 may also be cured. Thermal compression head 612/712 may be used to cure the barrier structures and/or adhesive. At this step, the normal vectors 612/712 and 641/741 may be aligned using combinations of forces 615/715 applied using thermal compression head 612/712.

In another, second embodiment, flip-chip bonding or mounting may occur in step 803. Solder such as 635 or 735 may be melted and flowed onto a contact pad such as 631 or 737 respectively. In flip-chip bonding, the contact pads 637/737 of the image sensor carrier 643/743 may be electrically connected to a respective contact pad 631/731 of the package substrate 620/720. The electrical connection between contact pads 637/737 and 631/731 may be performed by heat reflow of solder on a pillar bump 633/733, by ultrasonic bonding, or by thermosonic bonding of a gold stud bump (not illustrated). At this step, the normal vectors 612/712 and 641/741 may be aligned using combinations of forces 615/715 applied using thermal compression head 612/712.

In step 807B, a barrier structure may be applied to an image sensor carrier, package substrate, and/or window. A barrier structure such as 610 or 710A or may be applied to image sensor carrier 643 or 743 respectively through a punch hole in substrate 620/720 such as punch hole 524 in substrate 520 of FIG. 5.

In step 809, a window may be attached to the flip chip bonded package. In the embodiment of FIG. 6, a window 611 may be attached to a lower surface of barrier structure 610. Adhesive may or may not be used to attach window 611 to the lower surface of barrier structure 610. In the embodiment of FIG. 7, window 711 may be attached to a lower surface of barrier 710B. Additionally, window 711 may be attached to package substrate 720 using adhesive 780 which may be a UV cured adhesive, heat cured adhesive, epoxy resin, or any other suitable adhesive. Adhesive may or may not be used to attach window 711 to the lower surface of barrier structure 710B.

In step 811, material of barrier structures 610/710, which may be a dry film, B-stage epoxy resin, or any other material with similar dielectric properties may be cured. Adhesive such as the adhesive used to attach window 611/711 may also be cured. Thermal compression head 612/712 may be used to cure the barrier structures and/or adhesive. At this step, the normal vectors 612/712 and 641/741 may be aligned using combinations of forces 615/715 applied using thermal compression head 612/712.

In step 813B, underfill may be deposited between discrete mounts 630/730. In the first embodiment, if the barrier structure is not yet cured, or attached to a lower surface, such as package 620 in the embodiment of FIG. 6, or window 711 in the embodiment of FIG. 7, barrier structures such as 610/710 may prevent underfill adhesive from contaminating an image sensor die 642/742 as shown in FIG. 4.

Figure 9:
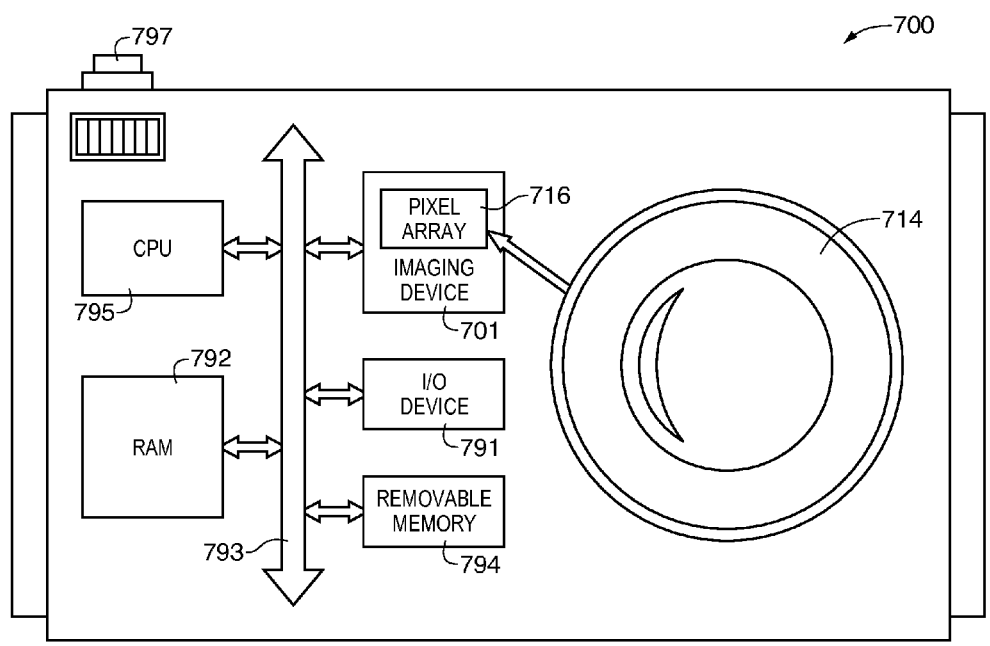
FIG. 9 is a block diagram of an imager employing one or more embodiments of FIGS. 6 and 7 in accordance with an embodiment.

FIG. 9 shows in simplified form a typical processor system 700, such as a digital camera, which includes an imaging device such as imaging device 701 which may be, for example a multi-camera imaging system with one or more pixel arrays 716. Device 701 may include the elements of system 900 (FIG. 1) or any relevant subset of the elements. Processor system 700 is exemplary of a system having digital circuits that could include imaging device 701. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 700, which may be a digital still or video camera system, may include a lens or multiple lenses indicated by lens 714 for focusing an image onto a pixel array or multiple pixel arrays such as a pixel array 716 when shutter release button 397 is pressed. Imaging device 701 may be a packaged image sensor as described in connection with FIGS. 6 and 7. Processor system 700 may include a central processing unit such as central processing unit (CPU) 795. CPU 795 may be a microprocessor that controls camera functions and one or more image flow functions and communicates with one or more input/output (I/O) devices 791 over a bus such as bus 793. Imaging device 701 may also communicate with CPU 795 over bus 793. System 700 may include random access memory (RAM) 792 and removable memory 794. Removable memory 794 may include flash memory that communicates with CPU 795 over bus 793. Imaging device 701 may be combined with CPU 795, with or without memory storage, on a single integrated circuit or on a different chip. Although bus 793 is illustrated as a single bus, it may be one or more buses or bridges or other communication paths used to interconnect the system components.

Various embodiments have been described illustrating systems with embedded data transmission capabilities. An image sensor package may include an image sensor carrier, an image sensor die, and a package substrate. An image sensor carrier may include a plurality of contact pads. An image sensor die may be attached to the image sensor carrier. Circuitry on the image sensor die may be coupled to the image sensor carrier contact pads via a plurality of metal interconnections such as metal traces or bond wires. A barrier structure may be formed on the image sensor carrier. The barrier structure may be formed out of B-stage resin, dry film, or any similar material. The barrier structure may surround the image sensor die and prevent contamination of the image sensor die by underfill adhesive and/or particles from the substrate or environment in which the image sensor is packaged.

An image sensor carrier may be coupled to a package substrate. A plurality of discrete mount structures may be used to couple the image sensor carrier to the package substrate. The package substrate may include a plurality of contact pads coupled to circuitry on the package substrate via metal traces or bond wires. A given discrete mount structure may include pillar bumps or a stud bump. Pillar bumps may be used in discrete mount structures when the package substrate is bonded to the image sensor carrier using flip-chip bonding. Stud bumps may be used when the package substrate is bonded to the image sensor carrier using thermosonic bonding techniques.

A window, or transparent structure, may be included in an image sensor package. The package substrate may have a hole. The hole may have an area that is at least the same as the area of an image sensing region on the image sensor die. The transparent structure may be formed below the package substrate, or the transparent structure may be formed in the hole. The transparent structure may include a field flattener lens element. An adhesive may be used to attach the transparent structure to the package substrate. The transparent structure may be attached to at least a portion of a lower surface of the barrier that is opposite the surface of the barrier that is attached to the image sensor carrier. Another portion of the lower surface of the barrier may be attached to the package substrate.

A thermal compression head may be used to attach or bond the package substrate to the image sensor carrier. The thermal compression head may also be used to cure adhesives in the image sensor package or to cure the barrier structure. The thermal compression head may be configured to varying forces on different portions of a surface, such as the surface of a window, the surface of a package substrate, and/or the surface of an image sensor carrier. As an example, the thermal compression head may be used to apply a force to first side of an image sensor that is greater than the force applied by the thermal compression head to second side of the image sensor that is opposite the first side. In the example of a surface with adjacent sides, the thermal compression head may apply a greater force to any subset of the sides than to the remaining sides. The thermal compression head may be used to melt solder bumps on discrete mount structures. The thermal compression head may be used to melt stud bumps on discrete mount structures. The thermal compression head may be used in flip-chip bonding. The thermal compression head may be used to align vectors normal to the image sensor die and normal to the transparent structure.

In manufacturing the image sensor package, the barrier structure may be applied to the sensor carrier, package substrate, and/or window before or after flip-chip bonding the image sensor carrier to the package substrate via a plurality of discrete mounts. After flip-chip bonding the image sensor carrier to the package substrate, a window or transparent structure may be attached to the image sensor package. The transparent structure may be attached to the package substrate and/or to at least a portion of a lower surface of the barrier structure that is opposite an upper structure of the barrier structure that is attached to the image sensor carrier. Depositing underfill adhesive between discrete mounts may occur after flip chip bonding, before or after attaching the transparent structure to the package substrate.

After attaching the transparent structure or transmittive element to the package substrate, the barrier structure and/or adhesives in the image sensor package may be cured. The barrier structure and/or adhesives in the image sensor package may be cured using the thermal compression head. Underfill adhesive may be applied after curing the barrier structure and/or adhesives in the image sensor package. Curing the barrier structure and/or adhesives in the image sensor package may involve using thermal or UV energy sources.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor package, comprising:
   an image sensor carrier;
   an image sensor die attached to the image sensor carrier;
   a barrier structure that surrounds the image sensor die, wherein the barrier structure has upper and lower surfaces and wherein the upper surface of the barrier structure is attached to the image sensor carrier;
   a plurality of carrier contact pads formed on the image sensor carrier, wherein each carrier contact pad is coupled to the image sensor die and wherein the barrier structure is formed between the plurality of carrier contact pads and the image sensor die; and
   a transparent structure that is attached to at least a portion of the lower surface of the barrier structure.

2. The image sensor package defined in claim 1, further comprising:
   a package substrate having a hole, wherein the hole has an area that is at least as large as an image sensing area of the image sensor die.

3. The image sensor package defined in claim 2, wherein the transparent structure has an area that is larger than the area of the hole, and wherein the transparent structure is attached to the entire lower surface of the barrier structure.

4. The image sensor package defined in claim 3, further comprising:
   an adhesive that is interposed between a portion of the transparent structure and the package substrate, wherein the adhesive attaches the portion of the transparent structure to the package substrate.

5. The image sensor package defined in claim 2, wherein the package substrate further comprises:
   a plurality of package contact pads, wherein each of the plurality of package contact pads is coupled to a respective carrier contact pad.

6. The image sensor package defined in claim 2, wherein the transparent structure has an area that is smaller than the area of the hole, and wherein the transparent structure is attached to a first portion of the lower surface of the package substrate.

7. The image sensor package defined in claim 6, wherein the package substrate is attached to a second portion of the lower surface of the package substrate, and wherein the first portion is different than the second portion.

8. The image sensor package defined in claim 1, wherein the barrier structure is formed out of a material selected from the group consisting of: a B-stage resin material and a dry film material.

9. A method for packaging an image sensor die, comprising:
   attaching the image sensor die to an image sensor carrier;
   depositing underfill adhesive below a portion of the image sensor carrier;
   applying a barrier structure to the image sensor carrier to prevent contamination of the image sensor die by the underfill adhesive; and
   after applying the barrier structure, bonding the image sensor carrier to a package substrate via a plurality of discrete mounts, wherein depositing underfill adhesive below the portion of the image sensor carrier comprises depositing underfill adhesive between the plurality of discrete mounts.

10. The method for packaging an image sensor die defined in claim 9, wherein bonding the image sensor carrier to a package substrate comprises:
    with a thermal compression head, applying a first force to a left side of the image sensor carrier;
    with the thermal compression head, applying a second force to a right side of the image sensor carrier, wherein a magnitude of the first force is different than a magnitude of the second force; and
    with the thermal compression head, applying a third force to a center region of the image sensor carrier, wherein the magnitude of the third force is different than the magnitudes of the first and second forces.

11. The method for packaging an image sensor die defined in claim 9, wherein the barrier structure has upper and lower surfaces, and wherein applying the barrier structure comprises attaching the upper surface of the barrier structure to the image sensor carrier, the method further comprising:
    attaching a first portion of the lower surface of the barrier structure to the package substrate.

12. The method for packaging an image sensor die defined in claim 11, wherein the package substrate has a hole, the method further comprising:
    attaching a transmittive element to a second portion of the lower surface of the barrier structure, wherein the transmittive element is in the hole of the package substrate.

13. A method for packaging an image sensor die, comprising:
    attaching the image sensor die to an image sensor carrier;
    depositing underfill adhesive below a portion of the image sensor carrier;
    applying a barrier structure to the image sensor carrier to prevent contamination of the image sensor die by the underfill adhesive; and
    before applying the barrier structure, bonding the image sensor carrier to a package substrate via a plurality of discrete mounts.

14. The method for packaging an image sensor die defined in claim 13, further comprising:
    attaching a transmittive element to the package substrate and the barrier structure, wherein the transmittive element structure is attached to the package substrate using an adhesive.

15. The method for packaging an image sensor die defined in claim 14, further comprising:
    curing the barrier structure; and
    curing the adhesive.

* * * * *